United States Patent [19]

Kamigawa

[11] Patent Number: 5,017,272
[45] Date of Patent: May 21, 1991

[54] METHOD FOR FORMING A CONDUCTIVE FILM ON A SURFACE OF A CONDUCTIVE BODY COATED WITH AN INSULATING FILM

[75] Inventor: Hidenori Kamigawa, Saga, Japan

[73] Assignees: Sanyo Electric Co., Ltd., Moriguchi; Saga Sanyo Industry Co., Ltd., Saga, both of Japan

[21] Appl. No.: 540,061

[22] Filed: Jun. 19, 1990

[30] Foreign Application Priority Data

Jun. 20, 1989 [JP] Japan .................................. 1-157399
Jul. 18, 1989 [JP] Japan .................................. 1-185598

[51] Int. Cl.$^5$ ............................................. C25D 9/02
[52] U.S. Cl. ............................................. 204/56.1
[58] Field of Search ................. 204/14.1, 56.1, 58.5

[56] References Cited

U.S. PATENT DOCUMENTS 4,929,316 5/1990 Harakawa .......................... 204/56.1

Primary Examiner—T. M. Tufariello
Attorney, Agent, or Firm—Armstrong, Nikaido, Marmelstein, Kubovcik & Murray

[57] ABSTRACT

An electrolytic polymerization method for forming a conductive film on a surface of a conductive body coated with an insulating film is disclosed.

In this method, a pulse-like electrolytic current is supplied between an electrode connected with the conductive body and a counter electrode in an electrolyte containing substance for forming a conductive high-polymer film.

13 Claims, 5 Drawing Sheets

METHOD FOR FORMING A CONDUCTIVE FILM ON A SURFACE OF A CONDUCTIVE BODY COATED WITH AN INSULATING FILM

BACKGROUND OF THE INVENTION

1. Field of the Invention

The present invention relates to a method for forming a film of a conductive substance, for instance a conductive high-polymer such as polypyrrole, polyaniline, polythiophene, polyfuran or the like, on a surface of a conductive body coated with an insulating film such as a dielectric oxide film and is suitably applied for manufacturing thermosensitive resistors, solid electrolytic capacitors, electroconductive films, electroconductive laminated films, gas sensors, printed circuit boards of aluminum oxide and the like.

2. Related Art

Conventionally, a chemical oxidation polymerization method has been used for forming a conductive high-polymer film on an insulating coating such as a dielectric oxide film having been formed by subjecting a conductive metal such as aluminum, tantalum or the like to a chemical conversion coating treatment. According to this method, the conductive high-polymer film is formed on the insulating coating by making a solution or gas of a monomer of a conductive high-polymer react to an oxidant.

Further, an electrolytic polymerization method has been used for forming a conductive high-polymer layer on an insulating coating or film. According to this method, a conductive thin film such as a conductive high-polymer film is formed on the insulating film by chemical oxidation polymerization beforehand and, thereafter, an electrolyzing current is supplied via an anode by contacting the same with the conductive thin film to form a conductive high-polymer film by the electrolytic polymerization.

These film forming methods have been applied for manufacturing solid electrolytic capacitors wherein conductive high-polymer films are used as an electrolyte. Namely, in the solid electrolytic capacitor, a conductive high-polymer film made of polypyrrole, polyaniline, polythiophene, polyfuran or the like is formed on an insulating dielectric oxide film using the chemical oxidation polymerization method or the electrolytic polymerization method.

Various manufacturing methods for solid electrolytic capacitors have been proposed in Japanese patent laid-open publications S63-173313, S64-32620 and S64-76713.

According to the method disclosed in the Japanese laid-open publication S64-76713, the dielectric oxide film formed on a conductive metal body is partially removed to short-circuit the metal body and a conductive thin film to be formed by the chemical oxidation polymerization method beforehand and, after forming the conductive thin film, a conductive film is formed by supplying an electrolytic current via the metal body. After forming the conductive thin film, the short-circuitted portion is insulated by making the same react to an oxidant and a deoxidant chemically or by applying a thermal energy using a laser beam or the like thereto.

Next, a conventional manufacturing method for solid electrolytic capacitors is explained concretely referring to FIGS. 6(a), 6(b) and 7.

At first, a dielectric oxide film 2 is formed on a surface of an aluminum body 1 composed of an sintered body of aluminum powder or an aluminum foil by electrolytic oxidation or air oxidation.

In the case of chemical oxidation polymerization, after applying a solution including an oxidant on the dielectric oxide film 2, the same is contacted to a solution including monomers of conductive high-polymer to form a conductive high-polymer layer 3 on the dielectric oxide layer 2 by the chemical oxidation polymerization. There are no problems in this forming process its self, but this method has such a disadvantage that it is impossible to obtain films having strength and electric properties enough for capacitors of this type.

Next, in the case of electrolytic polymerization, a capacitor element 6 with a lead wire 5 connected to the metal body 1 on which the conductive high-polymer layer 3 is formed by the chemical oxidation polymerization is dipped in an electrolyte 9, containing electrolytic supporting substances and monomers of a conductive high-polymer and a positive voltage is applied from a direct current power source 10 of constant voltage and current by contacting an external electrode 8 made of platinum or carbon with the conductive high-polymer thin film 3. The negative voltage of the DC power source 10 is supplied to a counter electrode 11 made of stainless steel or the like to perform an electrolytic oxidation polymerization.

According to the electrolytic oxidation polymerization, it is possible to obtain a conductive high-polymer film 4 of good quality but the current supplying method for forming the conductive high-polymer film 4 on the dielectric oxide film 2 is quite difficult.

As mentioned above, according to this current supplying method, the conductive high-polymer thin film 3 is formed on the dielectric oxide film 2 beforehand by the chemical oxidation polymerization and the external electrode 8 is contacted with the conductive high-polymer thin film 3 to supply an electrolytic current.

According to the above current supplying method, the current density becomes different due to the degree of contact of the external electrode resulting in that it is difficult to form a uniform film. Further, a significant loss of the electrolytic substance is inevitable since a conductive high-polymer film 4a is also formed on the external electrode 8.

Further more, as indicated by a reference numeral 4b in FIG. 6(b) the dielectric oxide film 2 is partially damaged upon removing the external electrode 8 adhered to the capacitor element 6 by the conductive high-polymer film 4a from the capacitor element 6 forcibly and thereby a leakage current is increased. A reference numeral 7 indicates a cathode lead adhered onto the conductive high-polymer film 4 by silver paste applied thereto.

FIGS. 8(a) and 8(b) show another method for applying an electrolytic current.

As shown in FIG. 8(a), the bottom portion of the conductive high-polymer film 3 formed by the chemical polymerization is cut off to form a metal portion 1a exposed outwardly and an electrolytic current is supplied by a lead wire 5 to form a conductive high-polymer film 4 on the surface of the exposed metal portion 1a by the electrolytic oxidation polymerization, as shown in FIG. 9. Thereafter, as shown in FIG. 8(b), the conductive high-polymer film 4 is insulated using an oxidant or a deoxidant to form an insulating layer 13 (See the Japanese patent laid-open publication S64-76713). This method has disadvantages in that an uneven film is apt to be formed on the exposed metal portion and the partial insulating treatment (13) for the conductive high-polymer film 4 is troublesome especially in the case of small capacitors of tip type.

SUMMARY OF THE INVENTION

One of object of the present invention is to provide a coating method for forming a film on an insulating film by an electrolytic polymerization technique.

Another object of the present invention is to provide a method for forming a conductive high-polymer film on a dielectric oxide film formed on a metal body without using any special electrode for supplying an electrolytic current.

In order to achieve these objects, according to the present invention, there is provided an electrolytic coating method for a conductive body on the surface of which an insulating film has been formed comprising the following steps forming an insulating film on a surface of a conductive body, dipping said conductive body and a counter electrode in an electrolyte, applying a pulse-like current between said conductive body and said counter electrode through said electrolyte and said insulating film in such a manner that any negative voltage is not applied to said conductive body and thereby forming a conductive high-polymer film on said insulating layer by electrolytic polymerization.

Said pulse-like current may be a current obtained by superposing a positive bias direct current on an alternating current, by chopping an alternating current or by flowing a direct current periodically or intermittently.

According to the present invention, since a pulse-like current is supplied in such a manner that any negative voltage is not applied to the anode, charge and discharge current flows through the insulating film formed on the conductive body and, thereby, a conductive film is formed on the insulating film by the electrolytic polymerization. The conductive film thus formed has a high density and a uniform thickness.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENT

The present invention will be described in detail by way of a solid electrolytic capacitor wherein an aluminum sintered body is used as a conductive metal body. However, the present invention is applicable for forming a conductive film on a metal body coated with an insulating film such as a dielectric oxide film as far as valve metal (the metal exhibiting a valve action is used).

First Preferred Embodiment

Figure 1:
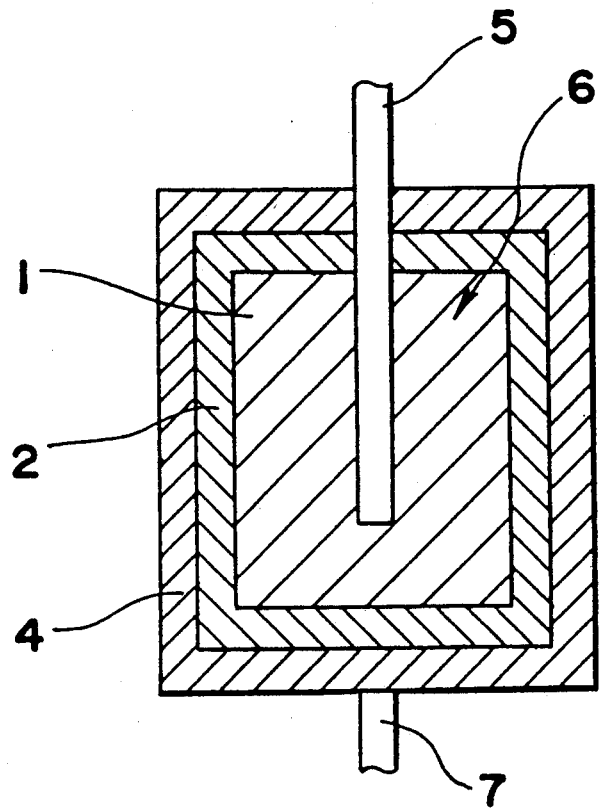
FIG. 1 is a schematic cross-sectional view of a solid electrolytic capacitor to be manufactured according to the present invention.
Figure 2:
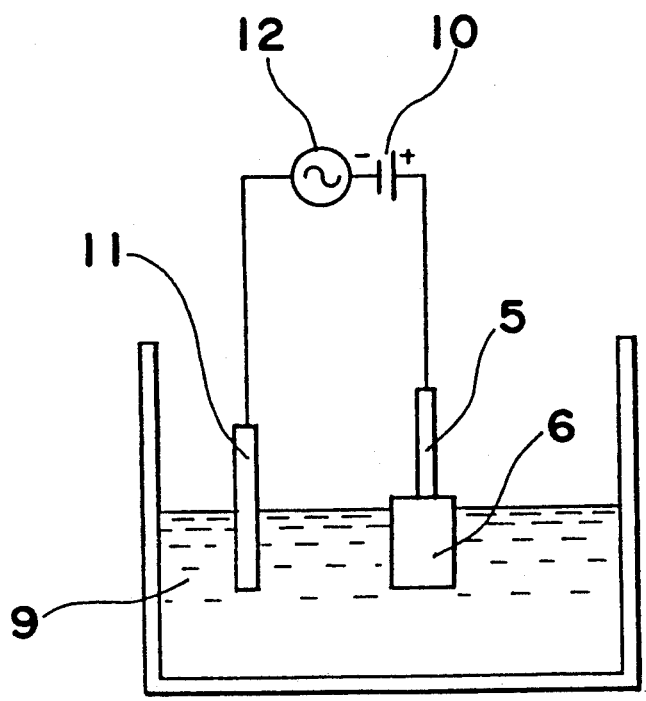
FIG. 2 is an explanatory view for showing a manner for supplying an electrolytic current upon electrolytic polymerization.

Referring to FIG. 1 and FIG. 2, a capacitor element 6 being comprised of an aluminum sintered body 1 and a lead wire 5 drawn out from the sintered body 1 is dipped in a solution of ammonium adipate (2wt%) and is subjected to an anode oxidation by applying 100 volts via the lead wire 5 to form a dielectric oxide film 2 on the surface of the sintered body 1.

Then, the capacitor element 6 is dipped in a solution of acetonitrile 9 containing pyrrole monomer (0.1 mol/l and tetraethyl ammonium-paratoluene-sulfonic acid (0.05 mol/l).

An electrolytic current is applied at a rate of 0.8 mA rms/P for 90 minutes between the lead wire 5 and a counter electrode 11 of stainless steel through the dielectric oxide film 2 by an AC power source 12 of 100 KHz to which a DC bias voltage 10 is superposed in order not to apply a negative voltage to the anode 5. Due to this electrolytic process, a uniform polypyrrole conductive high-polymer film 4 is formed on the dielectric oxide film 2. The capacitor element 6 is cleaned with acetone and dried. Then, a cathode lead 7 is adhered thereto by Ag paste and the element is molded by epoxy resin and is subjected to an aging treatment of 25 V (DC). Thus, a solidelectrolytic capacitor is obtained.

First Comparison Example

In order to compare the present method with the conventional method, a capacitor is prepared by the conventional method.

After forming a dielectric oxide film 2, a capacitor element is dipped in a solution of hydrogen peroxide (1 mol/l) and sulfuric acid (0.2 mol/l) for ten minutes and in pyrrole monomer for 30 minutes. Thereby, a polypyrrole film 3 is formed on the oxide film 2. Thereafter, the capacitor is subjected to cleaning, drying an intermediate chemical conversion treatment for repairing the oxide film. After preparing an anode by contacting a platinum wire 8 of a diameter 0.3 mm onto the chemical oxidation polymerized conductive high-polymer film 3 and a cathode 11 comprised of a stainless steel plate, a constant electrolytic current of 0.8 mA/P is applied therebetween for 90 minutes to form an electrolytic polymerization film 4 of polypyrrole. Thereafter, the platinum wire 8 is separated from the capacitor element 6 and a capacitor is obtained by subjecting the element to cleaning, drying and molding.

Table 1 shows properties of the capacitors according to the first preferred embodiment and the first comparison example.

TABLE 1

|  | Cap (μF) | tan δ (%) | E.S.R. (mΩ) | 25 V/60 sec L.C. (μA) |
|---|---|---|---|---|
| Embodiment 1 | 0.64 | 1.1 | 200 | 0.01 |
| Comparison Example 1 | 0.47 | 1.8 | 450 | 1.0 |

In this table, Cap, tan δ, E.S.R.. and L.C. indicate electrostatic capacitance, tangent of the loss angle δ, equivalent series resistance and leakage current, respectively and Cap and tan δ were measured at 120 Hz and E.S.R. is measured at 100 KHz.

Second Preferred Embodiment

Similarly to the first preferred embodiment, an aluminum sintered body 6 coated with a dielectric oxide film 2 is dipped in a solution of acetonitrile 9 containing pyrrole monomer (0.1 mol/l) and tetraethyl ammoniumparatoluenesulfonic acid (0.05 mol/l). A charge and discharge cycle of charge of 1 sec. and discharge of 9 sec. is repeated between a lead wire 5 as an anode and a stainless steel plate 11 as a cathode for 120 minutes supplying a power of a voltage of 50 volts and a current of 0.5 mA/P and, thereby, a uniform conductive high-polymer film 4 of polypyrrole is obtained. A cathode lead 7 is bonded onto the film 4 by Ag paste and a capacitor is completed by molding the capacitor element with epoxy resin and aging the same at 25 volts (DC).

Second Comparison Example

Similarly to the first comparison example, a conductive high-polymer film 3 is formed by the chemical oxidation polymerization and an electrolytic treatment of a constant current of 0.5 mA/P is performed for 120 minutes between an anode comprised of a platinum wire 8 of a diameter of 0.3 mm contacted onto the film 3 and a cathode of a stainless steel plate 11 to form an electrolytic polymerization film 4 of polypyrrole. After separating the platinum wire 8 from the capacitor element 6, the same was subjected to cleaning, drying and molding treatments.

Table 2 show properties of the capacitors obtained according to the second preferred embodiment and the second comparison example.

TABLE 2

|  | Cap (μF) | tan δ (%) | E.S.R. (mΩ) | 25 V/60 sec L.C. (μA) |
|---|---|---|---|---|
| Embodiment 2 | 0.63 | 1.2 | 220 | 0.01 |
| Comparison Example 2 | 0.46 | 1.9 | 480 | 1.2 |

Third Preferred Embodiment

In the first and second preferred embodiments, the conductive high-polymer film is formed directly on the dielectric oxide film 2 by the electrolytic polymerization, however, it is also possible to form a conductive high-polymer film, according to the electrolytic polymerization method, on a conductive high-polymer film having been formed on the dielectric oxide film according to the chemical oxidation polymerization method. The latter method is advantageous for forming a uniform conductive high-polymer film by the electrolytic polymerization.

Figure 3:
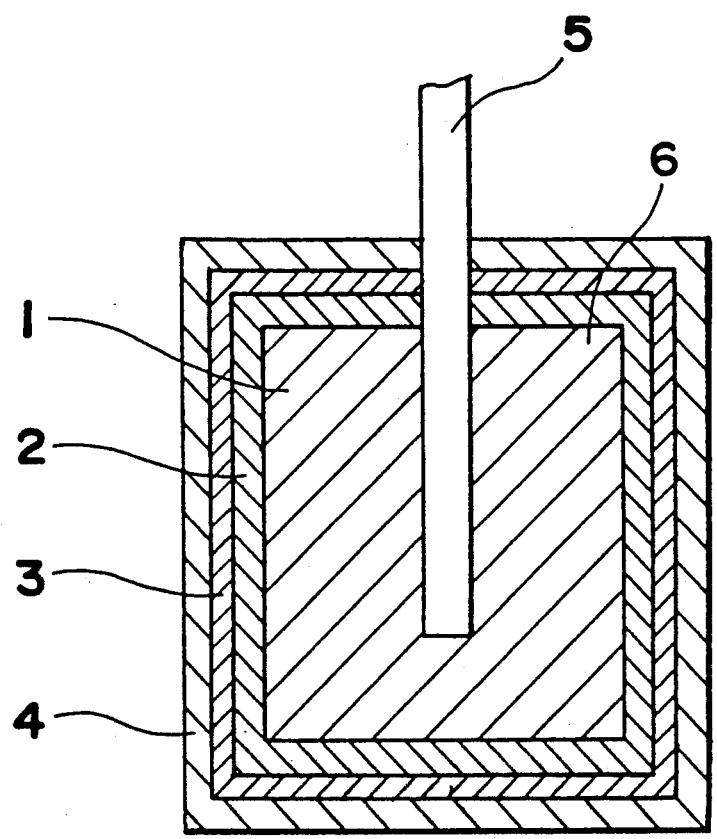
FIG. 3 is a schematic cross-sectional view of a solid electrolytic capacitor according to another preferred embodiment of the present invention.

According to this method, as shown in FIG. 3, a dielectric oxide film 2 is formed by subjecting an aluminum sintered body 1 to an anode oxidation and, then, the capacitor element 6 is dipped in a solution containing hydrogen peroxide (1 mol/l) and sulfuric acid (0.2 mol/l) for 10 minutes and in pyrrole monomer for 30 minutes to form a polypyrrole film 3 on the oxide film 2 by the chemical oxidation polymerization. After cleaning and drying the same, a chemical conversion coating treatment is made to repair the oxide film.

Next, a conductive high-polymer film 4 of polypyrrole is formed on the polypyrrole film 3 in such a manner as shown in FIG. 2. This method is advantageous in that a uniform film is easily obtained.

In stead of the polypyrrole film 3, it is possible to form a conductive layer of manganese diorite on the dielectric oxide film 2 by dipping the aluminum sintered body 1 coated with the dielectric oxide film 2 in a solution of manganese nitrate and heating the same to decompose thermally. Thereafter, a conductive polypyrrole film 4 is formed on the conductive layer of manganese dioxide. Further, the commercial AC power source can be used in stead of the AC power source 12 of 100 KHz in this preferred embodiment.

Fourth Preferred Embodiment

In this embodiment, the present invention is applied to a gas sensor with a semiconductive polymer such as polypyrrole.

In this type gas sensor, a change in the conductivity of the polymer is detected which is caused by chemical doping or off doping in the gas phase by a gas functioning as a doner or an acceptor to the polymer. In this case, a considerably thick film is needed since a relatively long distance between electrodes is necessary for detecting or sensing the gas.

Figure 4:
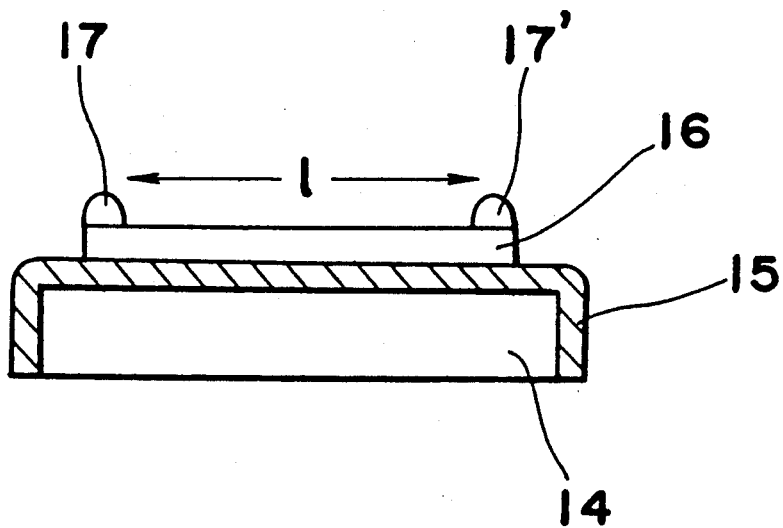
FIG. 4 is a schematic cross-sectional view of a gas sensor manufactured according to the present invention.

As shown in FIG. 4, in this type of gas sensor, an insulating layer 15 is formed on a metal foil 14 such as aluminum foil by oxidation and a semiconductive polymer layer 16 of polypyrrole is formed on the insulating layer 15. The electrolytic coating method according to the present invention is applied upon forming the semiconductive polymer layer 16. According to the present invention, it is possible to form a uniform film over a wide area and, thereby, to guarantee a long distance δ between electrodes 17 and 17'. This enhances the sensitivity of the gas sensor.

Fifth Preferred Embodiment

In this preferred embodiment, the present invention is applied to a conductive composite film.

The conductive composite film has both of an excellent mechanical property of the high-polymer film and a conductive property of the conductive high-polymer.

Figure 5:
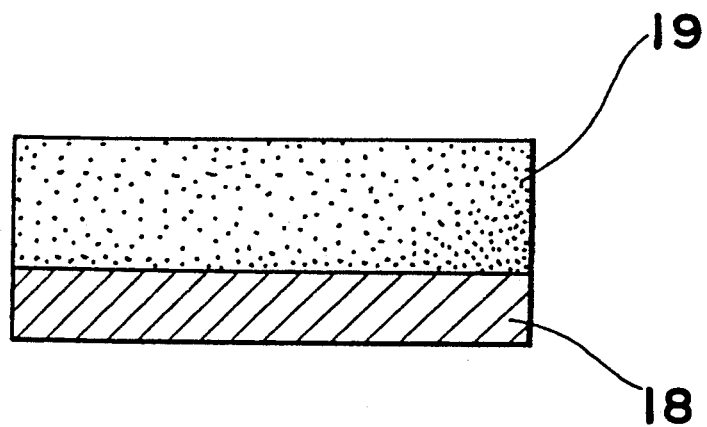
FIG. 5 is a schematic cross-sectional view of a conductive composite film to be manufactured according to the present invention.
Figure 6A:
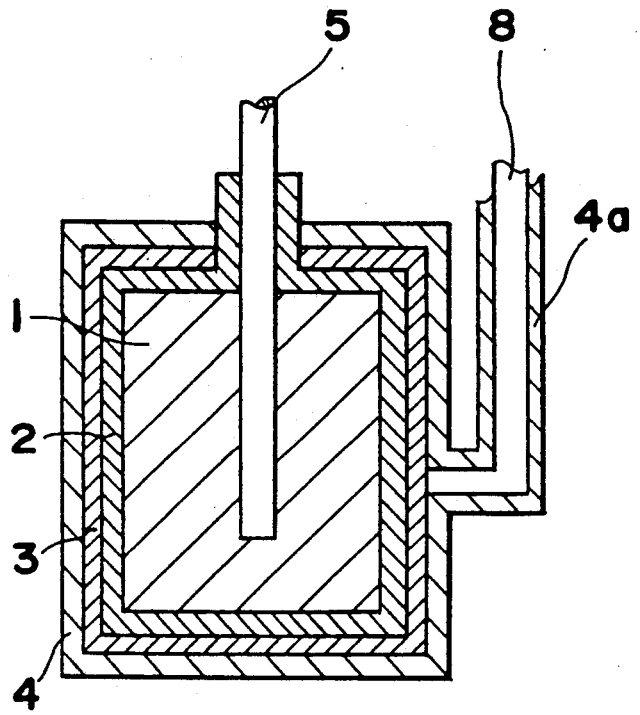
FIGS. 6(a) and 6(b) are explanatory views for showing a conventional manufacturing method of a solid electrolytic capacitor.
Figure 6B:
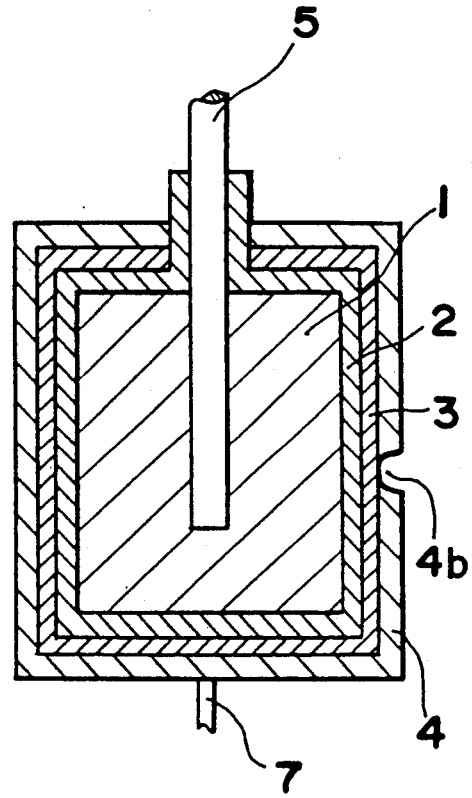
Figure 7:
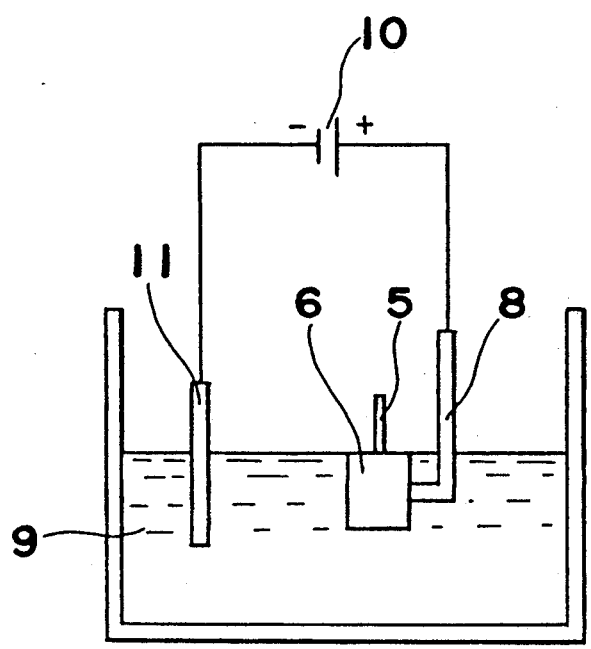
FIG. 7 is an explanatory view for showing the conventional manufacturing method of a solid electrolytic capacitor.
Figure 8A:
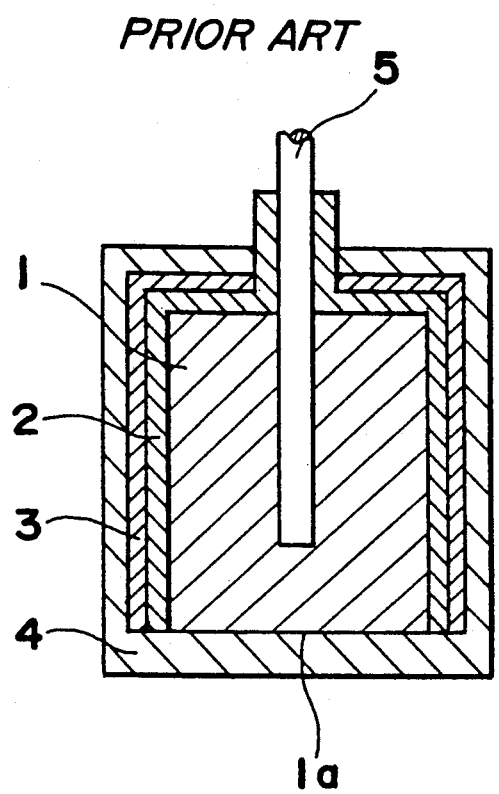
FIGS. 8(a) and 8(b) are schematic cross-sectional views for showing another conventional manufacturing method of the solid electrolytic capacitors and FIG. 9 is an explanatory view for showing a conventional electrolytic polymerization method.
Figure 8B:
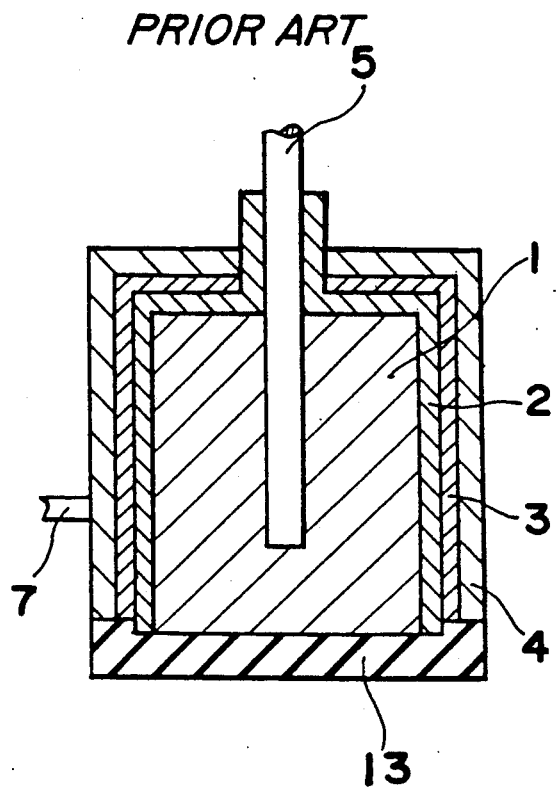
Figure 9:
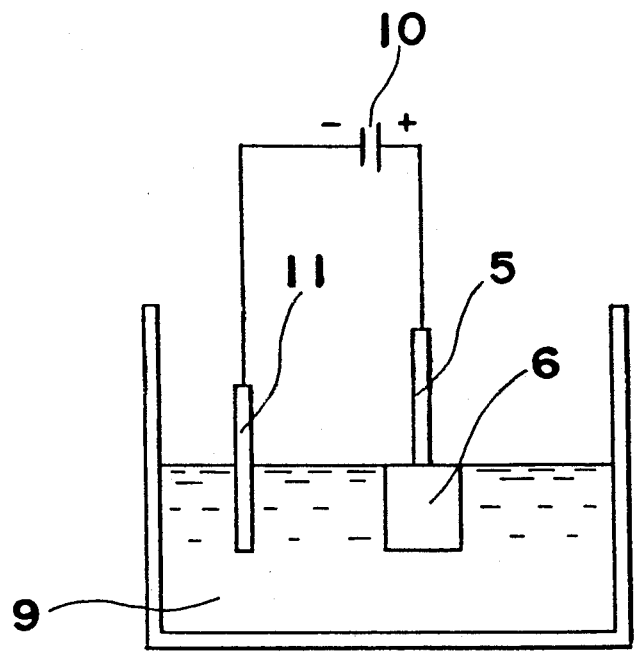

Conventionally, referring to FIG. 5, conductive composite films are obtained by performing an electrolytic polymerization for high-polymer films 19 laminated on electrodes 18 under such a condition that monomers and anions can diffuse well in the film. However, in this case, it is inevitable for the high polymer in the film to swell and, thereby, the mechanical property of the high-polymer film as the base is deteriorated fairly.

Contrary to this, according to the present invention, conductive high-polymer films can be obtained without accompanying swelling of the high-polymer, the mechanical property of the high-polymer film can be maintained without any deterioration.

As mentioned above, in the present invention, an AC current superposed a DC bias current or a DC current flowing periodically or intermittently is used upon electrolytic polymerization and, therefore, charging and/or discharging current can flow even in the case that an insulating film such as a dielectric oxide film is formed on a surface of a valve metal (metal foil having a valve action).

Accordingly, a conductive film of a high-polymer such as pyrrole, thiophene, aniline, furan or the like resolved in the electrolyte is formed on the oxide film of the valve metal to which a positive voltage is applied. Upon manufacturing solid electrolytic capacitors according to the present invention, the electric power for the electrolytic polymerization is supplied through a lead wire as a drawing electrode of the capacitor without any special electrode and, accordingly, it becomes possible to form a uniform conductive high-polymer film without damaging the capacitor element. This guarantees a small leakage current. Further, since it is possible to form an electrolytic polymerization film of conductive high-polymer with a good quality directly on a dielectric oxide film, the electrical properties of the capacitor are improved.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. Electrolytic coating method for a conductive body on the surface of which an insulating film has been formed comprising the following steps
   (a) forming an insulating film on a surface of a conductive body,
   (b) dipping said conductive body and a counter electrode in an electrolyte,
   (c) applying a pulse-like current between said conductive body and said counter electrode through said electrolyte and said insulating film in such a manner that any negative voltage is not applied to said conductive body and
   (d) thereby forming a conductive high-polymer film on said insulating layer by electrolytic polymerization.

2. The method as claimed in claim 1 wherein at least one conductive substance selected from a group including pyrrole, thiophene, aniline and furan is resolved in said electrolyte.

3. The method as claimed in claim 1 or 2 wherein said pulse-like current is a current obtained by superposing a positive bias direct current on an alternating current.

4. The method as claimed in claim 1 or 2 wherein said pulse-like current is a direct current flowing periodically or intermittently.

5. The method as claimed in claim 1 or 2 further comprising a step for forming a conductive high-polymer layer on said insulating film by chemical oxidation polymerization prior to forming said conductive high-polymer film by electrolytic polymerization.

6. Method for manufacturing solid electrolytic capacitors comprising the following steps
   (a) forming an insulating dielectric oxide film on a surface of a valve metal,
   (b) dipping said valve metal and a counter electrode in an electrolyte
   (c) applying a pulse-like current between said valve metal and said counter electrode through said electrolyte and said insulating dielectric oxide film in such a manner that any negative voltage is not applied to said valve metal and
   (d) forming a conductive high-polymer layer on said dielectric oxide film by electrolytic polymerization.

7. The method as claimed in claim 6 wherein said valve metal is either of aluminum and tantalum.

8. The method as claimed in claim 6 wherein at least one conductive substance selected from a group including pyrrole, thiophene, aniline and furan is resolved is said electrolyte.

9. The method as claimed in claim 6 wherein said pulse-like current is a current obtained by superposing a positive bias direct current on an alternating current.

10. The method as claimed in claim 6 wherein said pulse-like current is a current obtained by chopping an alternating current.

11. The method as claimed in claim 6 wherein said pulse-like current is a direct current flowing periodically or intermittently.

12. The method as claimed in any one of the preceding claims 6 to 11 further comprising a step for forming a conductive high-polymer layer on said dielectric oxide film by chemical oxidation polymerization prior to forming said conductive high-polymer layer by electrolytic polymerization.

13. The method as claimed in any one of the preceding claims 6 to 11 wherein said pulse-like current is applied to said valve metal through a lead wire connected thereto beforehand.

* * * * *